June 17, 1969
A. P. ARNTSEN ET AL
DOUBLE TUNED FREQUENCY SELECTIVE CIRCUIT PROVIDING A CONSTANT BANDWIDTH
Filed April 14, 1964
3,450,994
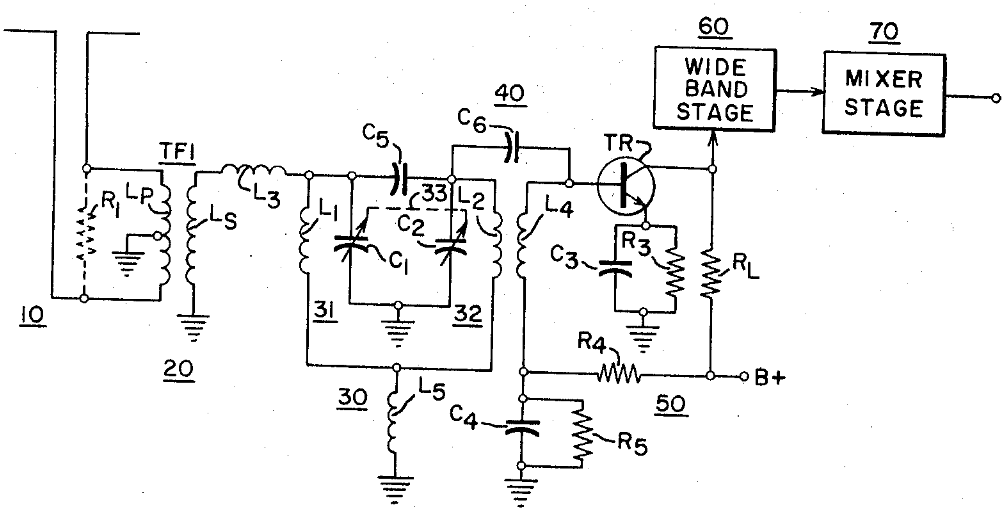
WITNESSES
Bernard R. Gieguez
James F. Young
INVENTORS
Arnt P. Arntsen and
Dirk J. Boomgaard.
BY
[signature]

3,450,994

DOUBLE TUNED FREQUENCY SELECTIVE CIRCUIT PROVIDING A CONSTANT BANDWIDTH

Arnt P. Arntsen and Dirk J. Boomgaard, Murrysville, Pa., assignors to Westinghouse Electric Corporation, East Pittsburgh, Pa., a corporation of Pennsylvania Filed Apr. 14, 1964, Ser. No. 359,560
Int. Cl. H04b *1/18;* H03j *5/00*
U.S. Cl. 325—383 1 Claim

ABSTRACT OF THE DISCLOSURE

The present disclosure provides a double tuned frequency selective circuit wherein two parallel tuned circuits are utilized for tuning. An input circuit, such as an antenna exhibiting a resistive component, is coupled to the first tuned circuit so that the loaded Q of the first tuned circuit is substantially proportional to the tuned frequency. An output circuit is utilized exhibiting a resistive component which is reflected across the second tuned circuit by a coupling circuit so that the loaded Q of the second tuned circuit is substantially proportional to the tuned frequency. A coupling circuit couples the first and second tuned circuits so that the effective coupling therebetween varies inversely with the tuned frequency so that a substantially constant bandwidth is provided across the frequency selective circuit.

The present invention relates to frequency selective circuits, and more particularly to double tuned frequency selective circuits providing a constant bandwidth.

The most commonly used tuning circuit in television receivers of today is the switched inductance type of tuner. Because of the inability to design a physical inductor having a wide enough variation in inductance over the VHF band, it has been necessary to switch in different values of physical inductor coil in order to accomplish tuning over channels 2 through 13. The use of switching contacts is expensive and moreover after a limited amount of use the switching contacts in the tuner become dirty and worn which results in erratic and unstable reception. The common tuner is thus one of limited reliability requiring constant maintenance and care. Variable capacitors having a wide enough differential in values of capacitance to provide continuous tuning over the VHF range may be designed with relative ease. However, the use of capacitive tuning raises the problem of providing a constant bandwith over all of the channels since in capacitive tuning the bandwidth varies substantially as the square of the tuned frequency. The problem of maintaining a constant bandwidth in capacitive tuned circuits has been overcome as may be seen in copending applications Ser. No. 359,561, filed Apr. 14, 1964 and Ser. No. 359,562, filed Apr. 14, 1964 both by A. P. Arntsen and assigned to the same assignee as the present application. These cited applications both show that by reflecting resistive components from the input antenna and a transistor load circuit across a capacitive tuned circuit that a constant bandwidth circuit may be provided and wherein also near optimum power transfer may be obtained.

In an ideal television tuning circuit, high skirt selectivity is desired because of the reduction in cross modulation obtained. That is, a plot of signal amplitude received versus frequency should present such a characteristic that the signal has a high amplitude over the bandpass about the tuned frequency, but, yet which has a rapidly decreasing amplitude above and below this bandpass. By providing a large attenuation of signals outside of the tuned bandpass cross modulation is reduced since even relatively high magnitude signals from neighboring channels will be greatly reduced in amplitude and therefore will have small effect on the output of the tuning circuit. It has been demonstrated that a double tuned circuit has much better skirt selectivity than does a single tuned circuit. See, for example, F. Longford-Smith Radiotron Designers Handbook, p. 422 (4th ed., 1952), and Terman, Radio Engineer's Handbook, pp. 160–161, 1943.

The usual television tuner has a single tuned circuit connected between the antenna and the RF amplifier and another tuned circuit between the RF amplifier and the mixer stage, with the tuned circuits being synchronously tuned. It has also been found that a double tuned circuit provides a better skirt selectivity than two synchronously tuned circuits while giving the same overall bandwidth. Because of the improved skirt selectivity and the low losses in the new double tuned circuit it is possible to greatly reduce the cross modulation by placing the double tuned circuits between the antenna and RF amplifier with only a broad band circuit connecting the RF amplifier and mixer stages.

It is therefore an object of the present invention to provide a new and improved double tuned frequency selective circuit.

It is a further object of the present invention to provide a new and improved capacitive-type double tuned frequency selective circuit providing a substantially constant bandwidth.

It is a further object of the present invention to provide a new and improved constant bandwidth frequency selective circuit which provides for optimum power transfer and low cross modulation.

Broadly, the present invention provides a double tuned frequency selective circuit in which each of the tunable elements of the tuned circuit has a loaded Q which is substantially proportional to frequency and with the effective coupling between the elements of the tuned circuit varying inversely with the tuned frequency.

These and other objects and advantages of the present invention may be found when considered in view of the following specification and drawing, in which:

The single figure is a schematic-block diagram of the double tuned frequency selective circuit of the present invention.

Referring to the single figure, a tuner circuit is shown in which the underlined numerals are general designations for the circuitry associated therewith. An antenna 10, which may be a conventional 300 ohm TV antenna, receives incoming radio frequency signals in the VHF range, for example. These signals are supplied through a coupling circuit 20 to a double tuned circuit 30. A coupling circuit 40 connects the tuned circuit 30 to an RF transistor amplifier 50. The output of the transistor amplifier 50 is applied to a wide band stage 60 whose output in turn is supplied to a mixer stage 70. The mixer output may then be supplied to subsequent circuitry of a television receiver. The double tuned circuit 30 includes a pair of parallel circuits 31 and 32. The parallel circuit 31 includes an inductor $L_1$ and a variable capacitor $C_1$ having one end commonly connected. The parallel circuit 32 includes an inductor $L_2$ and a variable capacitor $C_2$ having one end commonly connected. The variable capacitors $C_1$ and $C_2$ are coupled so that may be tuned synchronously. This connection is shown schematically by a dotted line 33. The bottom end of the capacitors $C_1$ and $C_2$ is grounded. In order to provide a constant bandwidth across the circuit, resistive components proportional to the resonant frequency W of the tuned circuit 30 are reflected across the tuned circuit 30. In other words to provide a substantially constant bandwidth the resistive component of the antenna 10 is reflected across the tuned circuit 31 with a value that increases as the square of the tuned frequency $W^2$. Also the resistive component of the input impedance of the input transistor of the transistor amplifier 50 is reflected across the tuned circuit 32 with a value that increases as the square of the tuned frequency $W^2$. That this is a criterion for constant bandwidth may be seen in the above cited copending applications and from the explanation of the double tuned circuit which is to follow.

In order to reflect a resistive component of the antenna 10, shown by the resistor $R_1$ in dotted line connected across the antenna 10, the antenna coupling circuit 20 is provided between the antenna 10 and the tuned circuit 31. The antenna 10 is connected across a transformer $TF_1$ through a primary winding $L_P$ which has a grounded center-tap. The transformer $TF_1$ has a secondary winding $L_S$ with one end grounded and the other end connected through an inductor $L_3$ to the top of the tuned circuit 31. As has been shown in copending application Ser. No. 359,561, the resistive component $R_1$ of the antenna 10 reflected across a tuned circuit, such as that of circuit 31, will increase as the square of the tuned frequency W. In other words the loaded Q of the circuit 31 will increase substantially proportionally to the resonant frequency since $Q=W/\Delta W$, where Q is the quality factor of the tuned circuit and $\Delta W$ the bandwidth.

A transistor, such as a transistor TR, the figure connected in a common emitter configuration is well known to have an input impedance including a resistive and a capacitive component. To provide a constant bandwidth across the entire circuit the resistive component of the input impedance of the transistor TR, which is connected in a common emitter configuration, is reflected across the tuned circuit 32 so as to increase as the square of the tuned frequency W. This is accomplished by connecting an inductor $L_4$ to the base electrode of the transistor TR, with the inductor $L_4$ being inductively coupled to the inductor $L_2$ of the tuned circuit 32. In addition a capacitor $C_6$ is connected between the top end of the inductors $L_2$ and $L_4$. As is shown in copending application Ser. No. 359,562 such a coupling will provide the wanted reflected resistive component across a similar tuned circuit. In other words, the loaded Q of the tuned circuit 32 will increase substantially proportionally to the tuned frequency W with the coupling to the transistor so being provided.

The RF transistor amplifier 50 is completed by connecting a capacitor $C_3$ from the emitter electrode to ground to serve as an AC ground. A stabilizing resistor $R_3$ is connected across the capacitor $C_3$ to ground. A biasing network including a series connection of a resistor $R_4$ and a resistor $R_5$ is connected between a B+ source, not shown, and ground. At the junction between the resistors $R_4$ and $R_5$ is connected the bottom end of the inductor $L_4$, which has its other end connected to the base electrode of the transistor TR. A bypass capacitor $C_4$ is connected between the bottom end of the inductor $L_4$ and ground. A load resistor $R_L$ is connected between the collector electrode and the B+ source, not shown.

Referring back to the double tuned circuit 30, the inductors $L_1$ and $L_2$ are the primary and secondary tank coils, respectively, of the double tuned circuit. The bottom ends of the inductors $L_1$ and $L_2$ are commonly connected to an inductor $L_5$, which may be a small self-inductance, with the other end of the inductor $L_5$ being grounded. Most of the coupling between the primary coil $L_1$ and the secondary coil $L_2$ is provided by the inductor $L_5$. Usually the coupling K is such that critical coupling is established, that is, with $QK=1$ where K is the coupling factor and Q is the quality factor for the primary of secondary coils $L_1$ or $L_2$, equal Q's of the primary and secondary tuner circuit being assumed. As was stated above, the resistive component of the antenna 10 is reflected across the inductor $L_1$ and is approximately proportional to the resonant frequency $W^2$. Therefore, the loaded Q of this circuit 31 will be substantially proportional to W thereby providing a constant bandwidth. The same relationship holds true with respect to the input resistance of the transistor TR being reflected across the inductor $L_2$ according to the square of the resonant frequency $W^2$, thereby causing the loaded Q of the tuned circuit 32 to also be substantially proportional to W.

Since for critical coupling it is required that $QK=1$, and since Q is proportional to W, K should be inversely proportional to W to satisfy the critical coupling equation. The coupling provided by the inductor $L_5$, however, is substantially constant with frequency and would ordinarily give overcoupling at the high frequency end of the band. To prevent this, a capacitor $C_5$ is connected between the top ends of the tuned circuits 31 and 32 to oppose the coupling of the inductor $L_5$. The coupling between the tuned circuits 31 and 32 produced by the capacitor $C_5$ alone is substantially proportional to the square resonant frequency $W^2$ and opposes the coupling provided by the inductor $L_5$. The value of the inductor $L_5$ is selected to give the wanted bandwidth at the low end of the band at about 57.5 mc./s. The value of the capacitor $C_5$ is now adjusted at the high end of the band at about 213.5 mc./s. to reduce the coupling to the wanted value. By proper selection of the values of the inductor $L_5$ and the capacitor $C_5$ critical coupling can therefore be obtained at both the high and low ends of the band. At the center of the band a slight overcoupling may result, however, since the center band is not used in a VHF tuner this will be of little importance.

From the above analysis, it can be seen that a substantially constant bandwidth will be provided across the entire tuned circuit with the input signals appearing at the antenna 10 being transferred across the circuit to the transistor TR where the signals are amplified and delivered to the wide band stage 60, which has its input connected at the collector electrode of the transistor TR. Since the resistive component reflected from the antenna 10 across the tuned circuit 31 will be substantially equal to the resistive component reflected from the input impedance of the transistor TR, there will be substantial matching across the entire circuit which will provide for nearly optimum power transfer across the circuit as well as providing a good signal-to-noise ratio. By the utilization of the double tuned circuit 30 between the antenna 10 and the transistor amplifier 50 a wide band stage 60 may be utilized. The wide band stage 60 may be so designed to reject image frequencies and thereby provide reduction of noise at the image frequency generated in the RF transistor. If this noise generated at the image frequency in the RF transistor was allowed to pass to the mixer it would mix with the wanted signal and cause poor signal-to-noise ratio. The rejection of image frequencies in the broad band circuit therefore prevents degradation in the signal-to-noise ratio. The output of the wide band stage 60 is then supplied to the mixer stage 70 to be mixed with a local oscillator output, not shown, with the output of the mixer stage being supplied to subsequent stages of the TV receiver. Thus, the use of the double tuned circuit 30 ahead of the RF transistor provides greatly improved cross modulation due to the improved skirt selectivity over a single tuned circuit, and, moreover, because of the excellent selectivity, permits the use of a wide band stage at the output of the RF amplifier stage rather than requiring a second tuned circuit after the RF amplifier. Furthermore, a constant bandwidth is maintained throughout the circuit with critical coupling being maintained both at the high and low end of the VHF band by self-inductance $L_5$ being utilized in conjunction with the capacitor $C_5$ opposing the coupling provided by the inductor $L_5$.

The advantages of capacitive tuning are also provided in the circuit eliminating the need for switching in various values of inductor coils for the various channels. However, it should be noted that the double tuned circuit arrangement in the switched inductance type of tuner could be utilized with a wide band stage following the RF amplifier stage to obtain the desirable results of low cross modulation and high power transfer with improved skirt selectivity.

Although the present invention has been described with a certain degree of particularity it should be understood that the present disclosure has been made only by way of example and that numerous changes in the details of circuitry, the combination and arrangement of elements, components and parts may be resorted to without departing from the spirit and the scope of the present invention.

We claim:

1. A frequency selective circuit comprising, input means having an impedance exhibiting a resistive component, a first parallel tuned circuit including inductive and variable capacitive elements, first coupling means coupling said input means and said first parallel tuned circuit for causing a resistive component to be reflected across said first tuned circuit from said input means which varies as the square of the tuned frequency, a second parallel tuned circuit including inductive and variable capacitive elements, output means having an impedance exhibiting a resistive component, second coupling means coupling said second tuned circuit and said output means for causing a resistive component to be reflected across said second tuned circuit from said output means which varies as the square of the tuned frequency, and a coupling circuit operatively connecting said first and second tuned circuits so that the effective coupling varies inversely with the tuned frequency to provide a substantially constant bandwidth.

References Cited

UNITED STATES PATENTS

| | | | |
|---|---|---|---|
| 2,912,656 | 11/1959 | Waring | 330—166 XR |
| 3,192,491 | 6/1965 | Hesselberth et al. | 325—383 XR |
| 3,234,480 | 2/1966 | Maeda | 330—21 |

FOREIGN PATENTS

| | | |
|---|---|---|
| 863,339 | 1/1941 | France. |

KATHLEEN H. CLAFFY, *Primary Examiner.*

R. S. BELL, *Assistant Examiner.*

U.S. Cl. X.R.

325—381, 385; 330—165; 334—40; 343—856